United States Patent
Hoshikawa

(10) Patent No.: US 10,765,049 B2
(45) Date of Patent: Sep. 1, 2020

(54) MEASUREMENT DEVICE

(71) Applicant: FUJI CORPORATION, Chiryu-shi (JP)

(72) Inventor: Kazumi Hoshikawa, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 17 days.

(21) Appl. No.: 15/749,676

(22) PCT Filed: Aug. 19, 2015

(86) PCT No.: PCT/JP2015/073253
§ 371 (c)(1),
(2) Date: Feb. 1, 2018

(87) PCT Pub. No.: WO2017/029730
PCT Pub. Date: Feb. 23, 2017

(65) Prior Publication Data
US 2018/0235119 A1    Aug. 16, 2018

(51) Int. Cl.
*H04N 5/232* (2006.01)
*H04N 7/18* (2006.01)
(Continued)

(52) U.S. Cl.
CPC ......... *H05K 13/0413* (2013.01); *G01B 11/00* (2013.01); *G06T 7/70* (2017.01);
(Continued)

(58) Field of Classification Search
CPC ........... H05K 13/0812; H05K 13/0061; H05K 13/0413; H05K 13/0417; H05K 13/089;
(Continued)

(56) References Cited

U.S. PATENT DOCUMENTS 5,754,677 A * 5/1998 Kawada ............... G06K 9/6203
382/141
6,457,232 B1 * 10/2002 Isogai ................ H05K 13/0812
29/833
(Continued)

FOREIGN PATENT DOCUMENTS

CN   1409592 A   4/2003
JP   5-167299 A   7/1993
(Continued)

OTHER PUBLICATIONS

Extended European Search Report dated Sep. 12, 2018 in Patent Application No. 15901712.8, 8 pages.
(Continued)

*Primary Examiner* — Nathnael Aynalem
(74) *Attorney, Agent, or Firm* — Oblon, McClelland, Maier & Neustadt, L.L.P.

(57) ABSTRACT

A measurement device that can improve measurement accuracy and increase the number of times of service of a measurement jig. The measurement device includes a movement control section that positions the measurement jig at an instructed position in the transfer direction, an imaging control section that images the positioned measurement jig by the measurement camera and acquires an image data, an image processing section that calculates an actual position of the measurement jig based on multiple measurement marks which are included in the image data, and an error measurement section that measures a positioning error in the transfer direction due to the driving device based on the instructed position and the actual position.

19 Claims, 5 Drawing Sheets

(51) Int. Cl.
  *H05K 13/04* (2006.01)
  *H05K 13/02* (2006.01)
  *G01B 11/00* (2006.01)
  *G06T 7/70* (2017.01)
  *H05K 1/02* (2006.01)
  *H05K 13/08* (2006.01)
(52) U.S. Cl.
  CPC ........... *H05K 1/0269* (2013.01); *H05K 13/02* (2013.01); *H05K 13/08* (2013.01)
(58) Field of Classification Search
  CPC .. H05K 1/0269; H05K 13/0419; H05K 13/02; H05K 13/043; H05K 3/0008; G06T 2207/30141
  USPC ........ 356/614; 382/141, 145, 209, 287, 151, 382/291, 293; 250/559.29
  See application file for complete search history.

(56) References Cited

U.S. PATENT DOCUMENTS

| | | | | |
|---|---|---|---|---|
| 6,915,565 B2* | 7/2005 | Isogai | ................ | H05K 13/0413 29/833 |
| 6,971,158 B2* | 12/2005 | Terui | ................. | H05K 13/0061 29/739 |
| 2001/0016786 A1* | 8/2001 | Takahashi | .............. | B23K 20/10 700/195 |
| 2002/0129508 A1* | 9/2002 | Blattner | ................ | F16C 29/005 33/706 |
| 2003/0051344 A1 | 3/2003 | Terui | | |
| 2005/0161498 A1* | 7/2005 | Byskov | ................ | H05K 13/087 235/376 |
| 2010/0229377 A1* | 9/2010 | Jindo | ................... | H04N 5/2355 29/709 |

FOREIGN PATENT DOCUMENTS

| | | | |
|---|---|---|---|
| JP | 2005-216974 A | | 8/2005 |
| JP | 2009-130092 A | | 6/2009 |
| JP | 2011-11748 A | | 1/2011 |
| JP | 2011011748 A | * | 1/2011 |

OTHER PUBLICATIONS

International Search Report dated Nov. 24, 2015, in PCT/JP2015/073253 filed Aug. 19, 2015.

* cited by examiner

MEASUREMENT DEVICE

TECHNICAL FIELD

The present application relates to a measurement device.

BACKGROUND ART

For example, PTL 1 discloses a device for inspecting accuracy of a transfer operation of a component tape in a feeder as a measurement device which measures the operation accuracy of a driving device in a measurement target. In addition, PTL 2 discloses a device which inspects accuracy of the transfer operation of electronic components in a component mounting machine. The measurement devices of PTL 1 and PTL 2 calculate an error between an instructed position and an actual position based on an image data acquired by imaging a measurement jig (master tape, matrix board) with a measurement camera and measure the operation accuracy of the driving device.

CITATION LIST

Patent Literature

PTL 1: JP-A-05-167299
PTL 2: JP-A-2005-216974

SUMMARY

Technical Problem

Accuracy assurance according to a measurement accuracy of a measurement device is required for a measurement jig used for measuring the operation accuracy in order to accurately recognize a positional relationship between the measurement jig and the measurement camera. Therefore, the measurement jig has a relatively high manufacturing cost and is appropriately managed such that an upper limit of the number of times of service is set. In addition to improving the measurement accuracy, the measurement device is required to increase the number of times of service of the measurement jig and extend the service life.

An object of the present disclosure is to provide a measurement device that can improve measurement accuracy and increase the number of times of service of a measurement jig.

Solution to Problem

A measurement device according to an aspect of the present disclosure measures an operation accuracy of a driving device by setting a measurement target that includes the driving device that moves a moving body in a defined transfer direction, as a target. The measurement device includes a measurement camera that has a predetermined camera visual field, a measurement jig that has a plurality of measurement marks arranged at a defined interval narrower than a width of the camera visual field in a transfer direction and along the transfer direction, a movement control section that sends an instruction value to the driving device to position the measurement jig at an instructed position in the transfer direction, an imaging control section that images the positioned measurement jig by the measurement camera and acquires an image data, an image processing section that calculates an actual position of the measurement jig based on the plurality of measurement marks which are included in the image data, and an error measurement section that measures a positioning error in the transfer direction due to the driving device based on the instructed position and the actual position.

Advantageous Effects

According to a configuration of the disclosure, the measurement device calculates the actual position of the measurement jig based on the plurality of measurement marks. Accordingly, since the positional relationship between the plurality of measurement marks is reflected on the measurement accuracy of the measurement device, the measurement accuracy of the measurement device can be improved. In addition, since the plurality of measurement marks indicate the actual positions of the measurement jig, respectively, the measurement device can calculate the actual position of the measurement jig by appropriately supplementing the plurality of measurement marks in the image data. Accordingly, it is possible to increase the number of times of service and extend the service life of the measurement jig.

DESCRIPTION OF EMBODIMENTS

Hereinafter, embodiments in which a measurement device of the disclosure is specified will be described with reference to the drawings. The measurement device is used for measuring the operation accuracy of the driving device in a measurement target. In the embodiment, an aspect to which the measurement device of the disclosure is applied will be exemplified by setting a feeder used in a component mounting machine as the measurement target. The component mounting machine is a device that holds the electronic component supplied by the feeder with a holding member and mounts the electronic component at a predetermined position on the circuit board.

Figure 1:
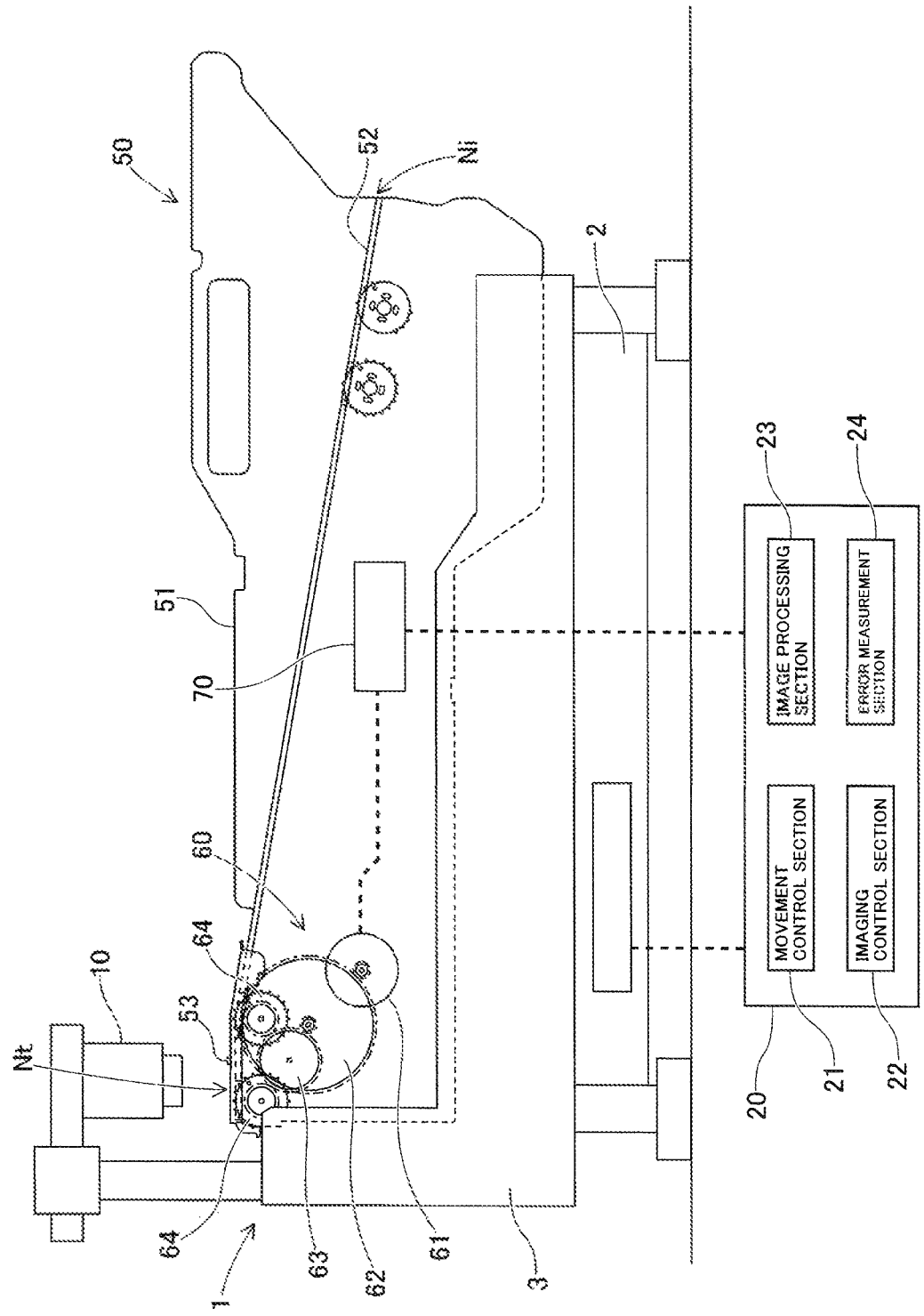
FIG. 1 is a front view illustrating the entire measurement device in an embodiment.

Embodiment (Configuration of Measurement Device 1)
The measurement device 1 is incorporated in a feeder maintenance apparatus, for example, and measures the accuracy of a transfer operation of a feeder 50. In this embodiment, as illustrated in FIG. 1, the measurement device 1 of the feeder 50 holds the feeder 50 which is a measurement target by a feeder holding section 3 provided on a base 2. The feeder 50 held in the measurement device 1 is supplied with electric power and is in a state of communicating with a control device 20 described below.

The measurement device 1 includes a measurement camera 10 and the control device 20. The measurement camera 10 is a digital imaging device having an imaging device such as a CCD (charge coupled device) or CMOS (complementary metal oxide semiconductor). The measurement camera 10 performs imaging within a range that is fitted in the camera visual field 11 (see FIG. 3) based on a control signal from the communicably connected control device 20. The measurement camera 10 sends the image data obtained by imaging to the control device 20.

In this embodiment, the measurement camera 10 is fixed to the base 2 of the measurement device 1 so that an optical axis is in the vertical direction. The measurement camera 10 is configured to be capable of imaging the feeder 50 held by the feeder holding section 3. More specifically, the measurement camera 10 is configured to be capable of imaging a component pickup section of the feeder 50. In addition, the camera visual field 11 of the measurement camera 10 is set within a predetermined range according to the configuration of a lens unit.

The control device 20 mainly includes a CPU, various memories, and a control circuit. The control device 20 controls a measurement process of the operation accuracy of the feeder 50. In addition, the control device 20 acquires identification information for identifying the feeder 50 and correction information used for the transfer operation of the feeder 50 by communication with the feeder 50. In addition, the control device 20 may be configured to be connected with a host computer which is an external device so as to be capable of communicating with each other, and to share information on the feeder 50 managed by the host computer. The detailed configuration of the control device 20 will be described below.

(Configuration of Feeder 50)

The feeder 50 is set in a slot of a component supply device in a component mounting machine (not illustrated). The feeder 50 performs pitch feeding of the component tape (corresponding to "moving body" of the disclosure) wound around the reel and supplies the electronic component so as to be capable of picking up at a pickup section Nt.

Figure 2:
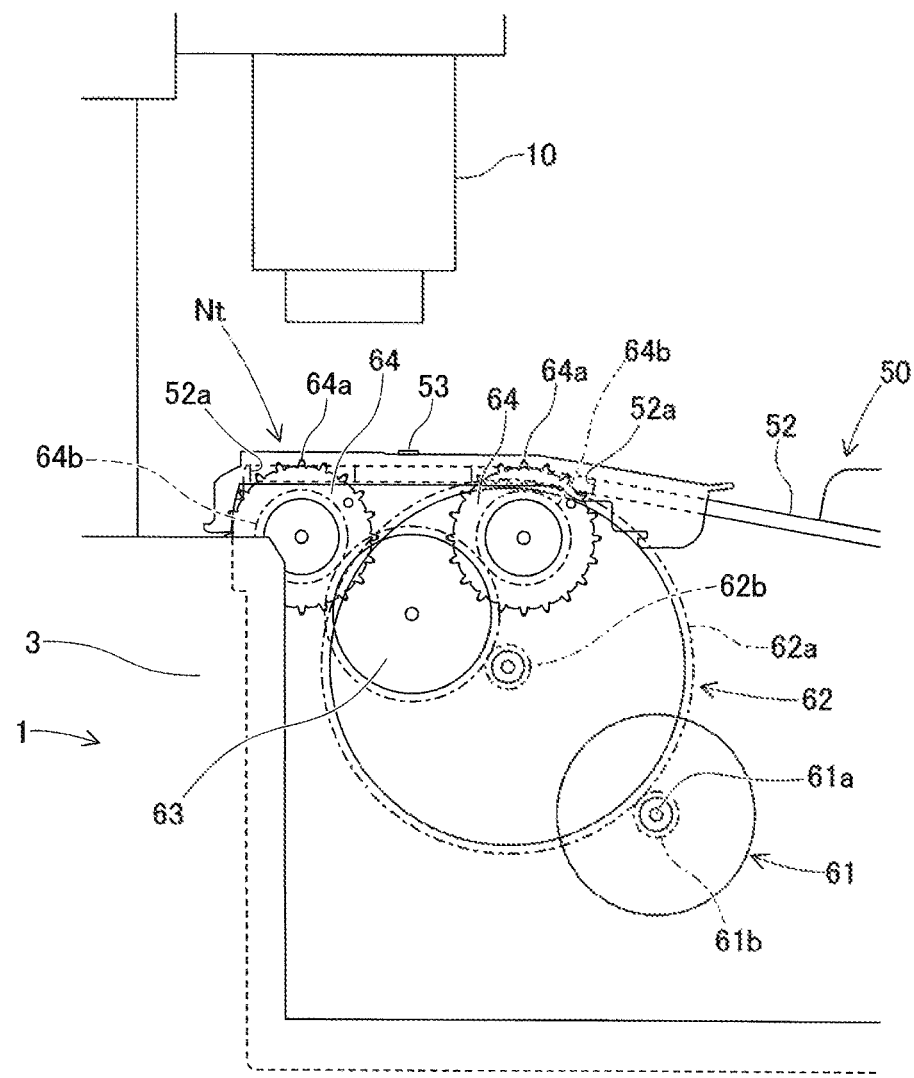
FIG. 2 is a view illustrating a configuration of a feeder as a measurement target.

As illustrated in FIG. 2, the feeder 50 includes a case 51, a rail 52, a fiducial mark 53, a driving device 60, and a feeder control section 70. The case 51 is formed in a flat box shape and is inserted into and fixed to the slot of the component supply device and the feeder holding section 3 of the measurement device 1. The rail 52 is provided over the component pickup section Nt on the front portion side from the tape insertion section Ni on a rear portion side of the case 51. An upper face of the rail 52 constitutes a portion of a transfer path for transferring the component tape.

The fiducial mark 53 is disposed in the vicinity of the component pickup section Nt and indicates the reference position of the feeder 50. The fiducial mark 53 is used for a process in which the component mounting machine recognizes a state where the feeder 50 is set in the slot of the component supply device. In this embodiment, the fiducial mark 53 is formed in a circular shape (see FIG. 3). The fiducial mark 53 is also used for measuring the operation accuracy of the feeder 50 by the measurement device 1. The fiducial mark 53 is arranged at a position which is fitted in the camera visual field 11 of the measurement camera 10 in a state where the feeder 50 is fixed to the feeder holding section 3 of the measurement device 1.

As illustrated in FIG. 2, the driving device 60 of the feeder 50 includes a motor 61, a reduction gear 62, an intermediate gear 63, and a pair of sprockets 64. In this embodiment, the motor 61 is a stepping motor that is driven in synchronization with pulse power supplied from the feeder control section 70. The motor 61 rotates a rotation shaft 61a according to the pulse power. The rotation shaft 61a of the motor 61 is provided with a driving gear 61b.

The reduction gear 62 and the intermediate gear 63 are rotatably supported by the case 51, respectively. The reduction gear 62 has a large-diameter gear 62a meshing with the driving gear 61b of the motor 61 and a small-diameter gear 62b set to a smaller number of teeth than the large-diameter gear 62a. The intermediate gear 63 meshes with the small-diameter gear 62b of the reduction gear 62. With such a configuration, the driving force output from the motor 61 decreases a rotation speed according to the difference in the number of teeth between the driving gear 61b and the large-diameter gear 62a and the difference in the number of teeth between the small-diameter gear 62b and the intermediate gear 63.

A pair of sprockets 64 is rotatably supported by the case 51, respectively. Engagement protrusions 64a engageable with feeding holes of the component tapes are formed on outer circumferential surfaces of the pair of sprockets 64. A portion of the engagement protrusion 64a protrudes from a window section 52a formed in the rail 52 to an upper face of the rail 52. In addition, the pair of sprockets 64 each has a driven gear 64b meshing with the intermediate gear 63 at phases which are different from each other. The pair of sprockets 64 transmits the decelerated driving force and are rotated by an angle corresponding to the pulse power.

The feeder control section 70 controls various operations in the feeder 50. The memory of the feeder control section 70 stores firmware which is executed in supply control of electronic components and the like and set values such as correction amount. The feeder control section 70 controls the transfer operation of the driving device 60 according to an instruction value externally input in a state where the feeder control section 70 is communicably held in the slot of the component supply device or the feeder holding section 3 of the measurement device 1. In other words, the feeder control section 70 functions as a driver that supplies pulse power to the motor 61.

Accordingly, the feeder 50 is configured so that the component tape can be moved in the defined transfer direction. Here, the transfer direction described above is the direction along the rail 52 from the tape insertion section Ni to the component pickup section Nt. In addition, a feeding operation for moving the component tape by the feeder 50 includes a continuous feeding for continuously feeding the component tape and a pitch feeding for intermittently feeding the component tape at intervals of accommodated electronic components, for example.

Here, since the moving body (target of transfer) in the feeder 50 is a component tape, it is assumed that the load applied to the driving device 60 from the moving body side is not more than a certain level. Therefore, the feeder control section 70 controls the driving device 60 having the stepping motor (motor 61) by open loop control. In other words, the feeder control section 70 determines the frequency and the number of pulses of the pulse power based on the input instruction value and supplies the pulse power to the motor 61.

In addition, when determining the pulse power, the feeder control section 70 reflects the correction amount according to a state of the driving device 60. The state of the driving device 60 includes the rotation angle of the reduction gear 62, for example. The rotation angle of the reduction gear 62 corresponds to the rotated angle of the reduction gear 62 according to rotation of the motor 61 in a case where the motor 61 is set as a control origin point angle and a state of the reduction gear 62 engaged with the driving gear 61b of the motor 61 is set as a reference.

The correction amount is set for each division obtained by dividing 360 degrees by the number of teeth of the large-diameter gear 62a of the reduction gear 62 according to the rotation angle of the reduction gear 62, respectively. Specifically, for example, the number of pulses corresponding to the rotation angle based on the instruction value is set to increase or decrease at a fixed rate as the correction amount.

The reason why the correction amount is reflected when the feeder control section 70 determines the pulse power is as follows. In the driving device 60, a deceleration mechanism (driving gear 61b, reduction gear 62, intermediate gear 63, driven gear 64b) for reducing the rotation speed of the driving force is interposed between the motor 61 and the pair of sprockets 64. This deceleration mechanism has unique inhomogeneities such as uneven rotation generated by errors in manufacturing and assembling errors of the feeder 50 and the like.

Therefore, even if the same pulse power is supplied to the motor 61, the movement amount of the component tape may be different from each other depending on a state of the driving device 60. Therefore, as described above, the feeder control section 70 sets a correction amount in advance according to a state of the driving device 60 and determines the pulse power based on the input instruction value and the correction amount according to the current state. The driving device 60 supplies the pulse power to the motor 61, and as a result, transfers the component tape by the transfer amount corresponding to the instruction value.

(Configuration of Measurement Jig)

Figure 3:
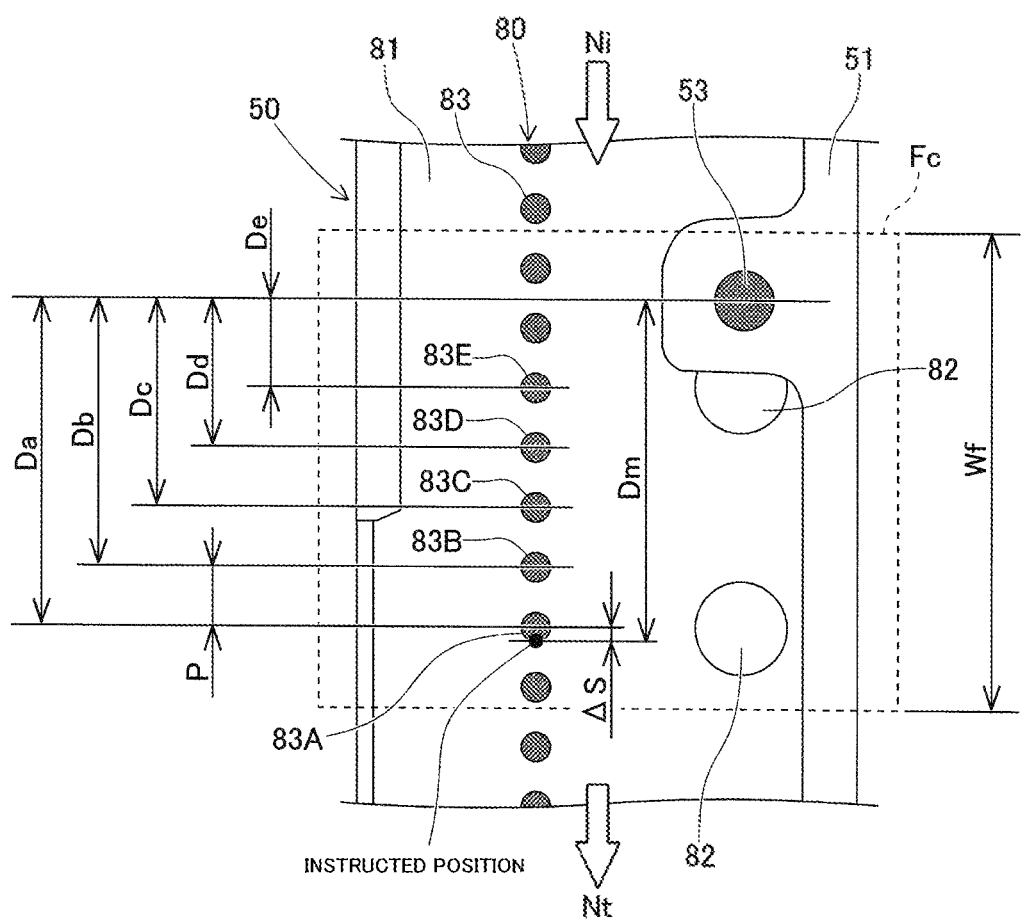
FIG. 3 is a view illustrating a relationship between a feeder and a measurement tape in the measurement of operation accuracy.

The measurement device 1 includes the measurement jig used for measuring the operation accuracy of pitch feeding of the feeder 50. In this embodiment, as illustrated in FIG. 3, the measurement jig is a dedicated measurement tape 80 imitating a component tape. The measurement tape 80 is formed of a material such as a metal which is hardly deformed in a case of being transferred by the feeder 50. The measurement tape 80 has a tape main body 81, multiple feeding holes 82, and multiple measurement marks 83.

The tape main body 81 is set to have a thickness corresponding to the component tape and is configured to be stretched in a band shape. The multiple feed holes 82 are through holes arranged in the extending direction of the tape main body 81 at the same interval as the feeding holes of the component tape. The multiple feeding holes 82 are configured to be engageable with the engagement protrusions 64a of the sprocket 64 of the feeder 50. With such a configuration, the measurement tape 80 is formed so as to be capable of performing pitch feeding by the driving device 60 corresponding to the component tape in a state of being loaded in the feeder 50.

As illustrated in FIG. 3, the multiple measurement marks 83 are arranged at a defined interval P (Wf>P) narrower than the width Wf in the transfer direction (up-down direction in FIG. 3) in the camera visual field 11 and along the transfer direction. The defined interval P is set so that multiple measurement marks 83 are included in the image data obtained by one imaging with the measurement camera 10. In this embodiment, the defined interval P is set to a value obtained by dividing the interval of the electronic components accommodated in the component tape by an integer.

In addition, in this embodiment, the measurement mark 83 is a circular through hole formed by a punching process with respect to the tape main body 81. The measurement tape 80 used as the measurement jig is guaranteed for accuracy relating to a defined interval P in the transfer direction of adjacent measurement marks 83, a position of the measurement mark 83 in the tape width direction (transverse orthogonal direction), and the accuracy of the shape (circularity in this embodiment). Accordingly, the guaranteed accuracy corresponds to the accuracy required for measuring the operation accuracy in the measurement device 1.

(Detailed Configuration of Control Device 20)

As illustrated in FIG. 1, the control device 20 of the measurement device 1 includes a movement control section 21, an imaging control section 22, an image processing section 23, and an error measurement section 24. The movement control section 21 feeds an instruction value to the driving device 60 via the feeder control section 70 to position the measurement tape 80 at the instructed position in the transfer direction with respect to the measurement camera 10. The movement control section 21 sends an instruction value to the feeder control section 70 so as to transfer the measurement tape by a defined amount from the current state of the driving device 60, for example.

The imaging control section 22 acquires image data (corresponding to the camera visual field 11 in FIG. 3) by imaging the positioned measurement tape 80 with the measurement camera 10. Specifically, the imaging control section 22 sends a control signal to the measurement camera 10 so that the measurement tape 80 partially fitted in the camera visual field 11 of the measurement camera 10 is imaged. The imaging control section 22 acquires the image data by imaging and stores the image data in association with the instruction value sent by the movement control section 21.

The image processing section 23 calculates the actual position of the measurement tape 80 based on the multiple measurement marks 83 (see FIG. 3) included in the image data. The actual position of the measurement tape 80 is the actual position of the measurement tape 80 positioned on the rail 52 of the feeder 50. As a method of calculating the actual position based on the image data, the image processing section 23 adopts a method of using the fiducial mark 53 included in the same image data in this embodiment.

Specifically, the image processing section 23 calculates the relative position of the measurement mark 83 with respect to the position of the fiducial mark 53 included in the image data and calculates the actual position of the measurement tape 80 based on the calculation result. In addition, the image processing section 23 is configured to use multiple measurement marks 83 included in the image data to calculate the actual position of the measurement mark 83. In this embodiment, the image processing section 23 calculates the actual position of the measurement tape 80 averaged based on the positions of the multiple measurement marks 83 and the defined interval P.

Further, the image processing section 23 determines the validity of each measurement mark 83 based on the measurement mark information relating to the multiple measurement marks 83. The measurement mark information may include the positions (for example, plane coordinates in which the fiducial mark 53 is set as the origin point), the shape (circularity of the measurement mark 83), and the like of multiple measurement marks 83 in the image data. The measurement mark information of this embodiment includes the process result of recognition of the position and shape of the measurement mark 83.

Here, an error may be included in the position and shape of the measurement mark 83 recognized by the image processing depending on an imaging environment and the state such as scratches on the surface of the measurement tape 80. Therefore, the image processing section 23 is configured to calculate the actual position of the measurement tape 80 using the measurement mark 83 determined to be valid based on the measurement mark information among the multiple measurement marks 83 included in the image data. The details of the actual position by the image processing section 23 will be described below.

The error measurement section 24 measures a positioning error in the transfer direction by the driving device 60 based on the instructed position corresponding to the instruction value sent to the feeder 50 and the actual position of the measurement tape 80. Specifically, the error measurement section 24 acquires the difference between the actual distance in the transfer direction between the actual position of the measurement tape 80 calculated by the image processing section 23 and the position of the fiducial mark 53 and the ideal distance based on the instructed position as a positioning error.

(Measurement of Accuracy of Transfer Operation)

The measurement process of the operation accuracy of the feeder 50 by the measurement device 1 will be described. Here, an aspect in which the measurement device 1 measures the positioning error in order to set an appropriate correction amount for the feeder 50 is exemplified. In addition, in the measurement process, the feeder 50 loaded with the measurement tape 80 is set in the feeder holding section 3 of the measurement device 1.

Figure 4:
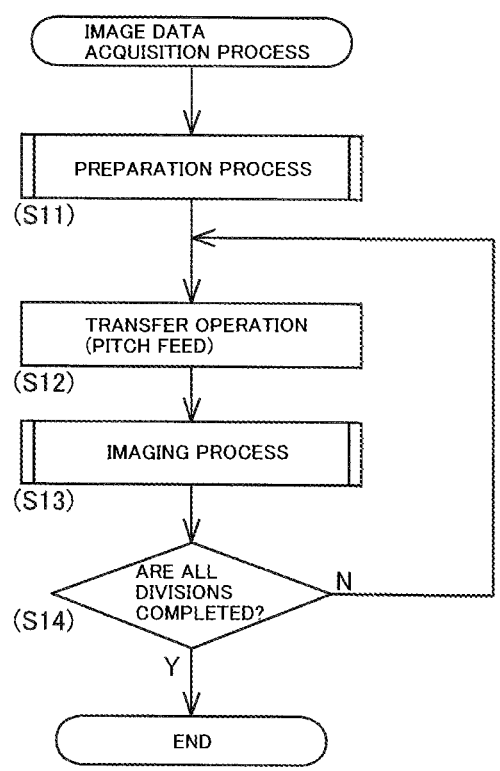
FIG. 4 is a flowchart illustrating an image data acquisition process for a feeder as a target.

First, as illustrated in FIG. 4, the measurement device 1 executes a preparation process for the feeder 50 held in the feeder holding section 3 (step 11 (hereinafter, "step" is expressed as "S")). In the preparation process, the control device 20 of the measurement device 1 acquires an identification code identifying the feeder 50 and a correction amount that is currently set by communicating with the feeder control section 70 of the feeder 50.

In addition, in the preparation processing (S11), the control device 20 sends an instruction value to the feeder control section 70 so that the motor 61 of the driving device 60 returns to the origin point angle. Accordingly, the motor 61 is rotated to the origin point angle for control, and the driving gear 61b is brought into a state of meshing with the large-diameter gear 62a of the reduction gear 62 in a predetermined phase.

Next, the movement control section 21 sends an instruction value to the feeder control section 70 so as to transfer the measurement tape 80 by one pitch (S12). The one pitch appropriately sets the interval of the electronic components accommodated in the component tape, for example. In this embodiment, one pitch is set as the transfer amount of the measurement tape 80 in a case where the large-diameter gear 62a of the reduction gear 62 is rotated by one tooth.

In addition, the feeder control section 70 does not apply the correction amount in the transfer of the measurement tape 80, since an object thereof is that the measurement of the operation accuracy sets an appropriate correction amount for the feeder 50. In other words, the feeder control section 70 supplies a fixed pulse power corresponding to one pitch to the driving device 60 and positions the measurement tape 80 at the pitch-fed instructed position.

The imaging control section 22 images the positioned measurement tape 80 with the measurement camera 10 and acquires image data (S13). The acquired image data is stored in the control device 20 in association with the instruction value sent by the movement control section 21, more specifically in association with the number of pitch feeding integrated from the origin point angle of the motor 61.

The control device 20 determines whether or not the imaging process (S13) is performed on the state of the driving device 60 divided by one pitch (state where large-diameter gear 62a of reduction gear 62 is rotated by one tooth in this embodiment) (S14). The control device 20 repeats the transfer operation (S12) and the imaging processing (S13) for all the divisions.

Figure 5:
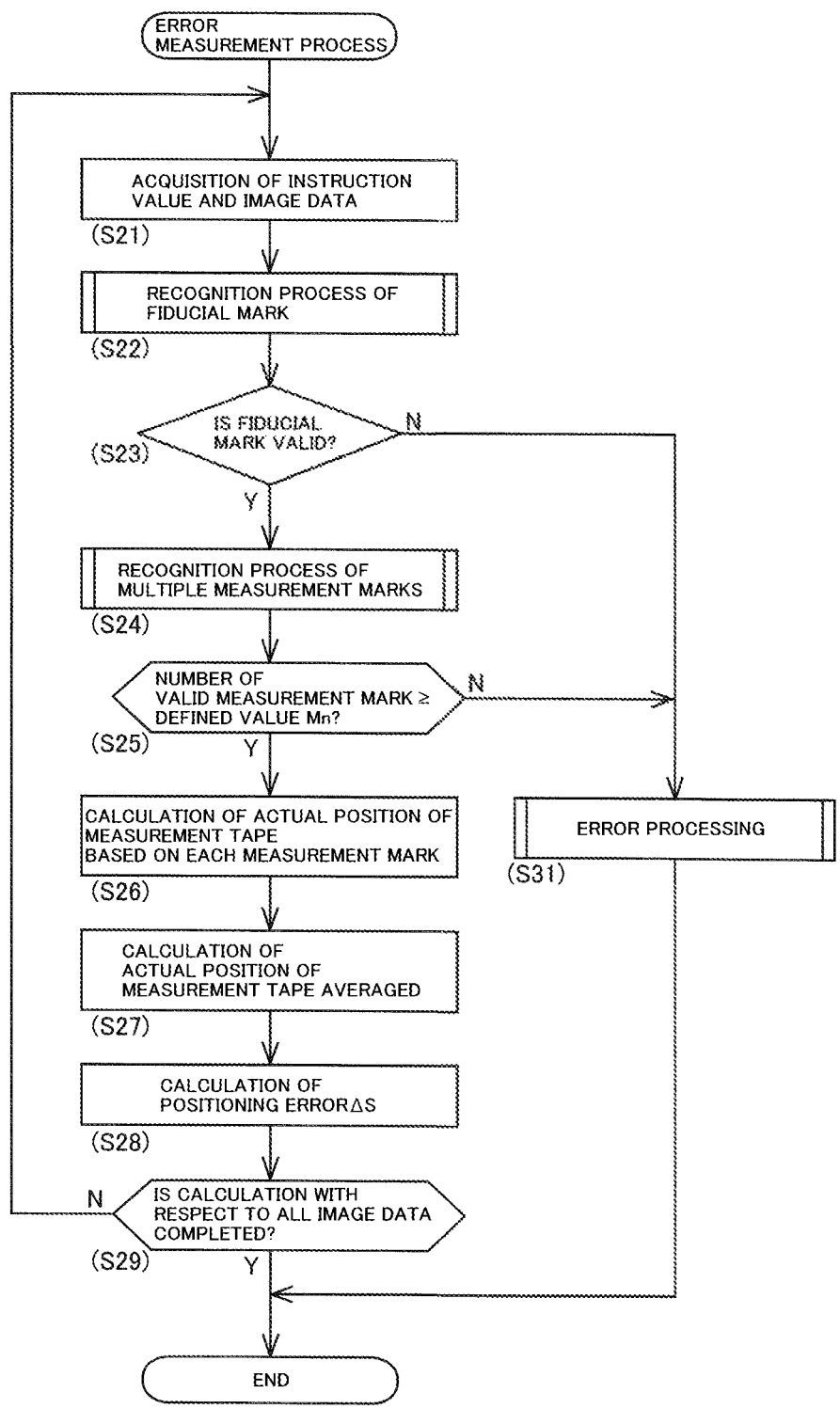
FIG. 5 is a flowchart illustrating a measurement process of a positioning error of a driving device.

Subsequently, as illustrated in FIG. 5, the control device 20 executes a positioning error calculation process. In this process, first, the image processing section 23 acquires an instruction value sent from the movement control section 21 and image data associated with the instruction value (S21). The image processing section 23 executes a process of recognizing the fiducial mark 53 included in the acquired image data (S22). Accordingly, fiducial mark information including the position and shape of the fiducial mark 53 in the image data is acquired.

The image processing section 23 determines whether or not the shape of the fiducial mark 53 in the fiducial mark information, specifically, the circularity is within an allowable range (S23). In a case where the circularity of the fiducial mark 53 is not within the allowable range (S23: No) since a reference position in the image data cannot be obtained, an error processing (S31) is executed and the measurement process of the operation accuracy of the feeder 50 is interrupted.

On the other hand, in a case where the circularity of the fiducial mark 53 is within the allowable range (S23: Yes), the image processing section 23 executes a process of recognizing the multiple measurement marks 83 (S24). Accordingly, measurement mark information including the relative position and shape of each measurement mark 83 with the position of the fiducial mark 53 as the origin point in the image data is acquired. Then, based on the measurement mark information, the image processing section 23 determines whether the number of measurement marks 83 which are valid for measuring the operation accuracy is equal to or larger than a defined value Mn (S25).

The defined value Mn is a value set in advance according to the accuracy required for the measurement process of the operation accuracy and is set to 2 (Mn=2) in this embodiment. In addition, the validity of the measurement mark 83 is determined by the position and shape of the measurement mark 83. First, the image processing section 23 determines whether or not the circularity of the measurement mark 83 is within the allowable range and excludes the measurement mark 83 that is not within the allowable range. Next, the image processing section 23 acquires the separation distance in the tape width direction with respect to the fiducial mark 53 for the measurement mark 83 whose circularity is within the allowable range. Then, the image processing section 23 excludes the measurement mark 83 whose acquired separation distance is not within the allowable range.

The image processing section 23 extracts the measurement mark 83 which is valid for the measurement processing of the operation accuracy as described above. In a case where the number of valid measurement marks 83 is less than the defined value Mn (S25: No), since the actual position of the measurement tape 80 cannot be calculated based on the image data, the error processing (S31) is executed and interrupts the measurement process of the operation accuracy of the feeder 50. On the other hand, in a case where the number of valid measurement marks 83 is equal to or larger than the defined value Mn (S25: Yes), the image processing section 23 calculates the actual position of the measurement tape 80 based on each measurement mark 83 (S26), respectively.

Here, as illustrated in FIG. 3, for example, in a case where it is determined that five consecutive measurement marks 83A to 83E among multiple measurement marks 83 in the image data are valid, the image processing section 23 calculates the actual distance Da to De in the transfer direction with respect to the fiducial mark 53 with respect to each measurement mark 83A to 83E. Then, the image processing section 23 calculates the actual position of the measurement tape 80 averaged based on the actual distances Da to De of the valid measurement marks 83A to 83E and the defined interval P in the transfer direction (S27).

The error measurement section 24 calculates the difference between the average actual distance Dv in the transfer direction between the actual position of the measurement tape 80 averaged and the position of the fiducial mark 53 and the ideal distance Dm based on the instructed position as the positioning error ΔS (S28). The control device 20 determines whether or not the calculation (S28) of the positioning error ΔS is performed for all the image data (S29). The control device 20 repeats the processes (S21 to S29) until the positioning error ΔS is calculated for all the image data.

The control device 20 respectively calculates and stores the correction amount according to a state of the driving device 60 based on the positioning error ΔS calculated corresponding to division by one pitch, respectively. In this manner, the measurement device 1 supplies fixed pulse power to the driving device 60 and calculates the appropriate correction amount based on the theoretical transfer amount of the measurement tape 80 in each section and the transfer amount actually measured by multiple measurement marks 83 included in the image data. This correction amount is transferred from the control device 20 to the feeder control section 70 of the feeder 50 and used for controlling the feeding operation of the feeder 50.

<Effects of Configuration of Embodiment>

The measurement device 1 measures the operation accuracy of the driving device 60 by setting the measurement target (the feeder 50) including the driving device 60 for moving the moving body (component tape) in the defined transfer direction as a target. The measurement device 1 includes a measurement camera 10 that has a predetermined camera visual field 11, a measurement jig (measurement tape 80) that has multiple measurement marks 83 arranged at a defined interval P narrower than a width Wf of the camera visual field 11 in a transfer direction and along the transfer direction, a movement control section 21 that sends an instruction value to the driving device 60 to position the measurement jig (measurement tape 80) at an instructed position in the transfer direction, an imaging control section 22 that images the positioned measurement jig (measurement tape 80) by the measurement camera 10 and acquires an image data, an image processing section 23 that calculates an actual position of the measurement jig (measurement tape 80) based on the multiple measurement mark 83 which are included in the image data, and an error measurement section 24 that measures a positioning error ΔS in the transfer direction due to the driving device 60 based on the instructed position and the actual position.

According to such a configuration, the measurement device 1 calculates the actual position of the measurement tape 80 based on the multiple measurement marks 83 (S26, S27). Thus, since the positional relationship between the multiple measurement marks 83 is reflected on the measurement accuracy of the measurement device 1, the measurement accuracy of the measurement device 1 can be improved. Since the multiple measurement marks 83 respectively indicate the actual positions of the measurement tape 80, the measurement device 1 can calculate the actual position of the measurement tape 80 by appropriately supplementing the multiple measurement marks 83 in the image data. Accordingly, it is possible to increase the number of times of service and extend the service life of the measurement tape 80.

In addition, the image processing section 23 acquires the positions of the multiple measurement marks 83 in the image data, respectively, and calculates an actual position of the measurement jigs (measurement tapes 80) averaged based on the positions and the defined intervals P of the multiple measurement marks 83. According to such a configuration, it is possible to reduce the influence on the image processing due to the posture of the measurement tape 80, fluctuations in the imaging environment, and the like. Thus, since the actual position of the measurement tape 80 can be calculated more accurately, the measurement accuracy of the measurement device 1 can be improved.

In addition, the image processing section 23 acquires the measurement mark 83 information including the positions or the shapes of the multiple measurement marks 83 in the image data and calculates the actual position of the measurement jig (measurement tape 80) by using the measurement mark 83 determined to be valid based on the measurement mark 83 information. According to such a configuration, the actual position of the measurement tape 80 can be calculated by excluding the measurement mark 83 unsuitable for the image processing for calculating the actual position of the measurement tape 80 and complementing another measurement mark 83. Accordingly, this makes it possible to increase the number of times of service and extend the service life of the measurement tape 80 as compared with a configuration in which the error processing is performed in a case where one measurement mark 83 is inappropriate for the image processing.

In addition, the fiducial mark 53 is disposed on the measurement target (feeder 50) based on a position that is fitted in the camera visual field 11. The image processing section 23 calculates the relative positions of the multiple measurement marks 83 with respect to the fiducial mark 53 included in the image data and calculates the actual position of the measurement jig (measurement tape 80) based on the calculation result. According to such a configuration, the actual position of the measurement tape 80 is calculated by using the image data including the fiducial mark 53 and the multiple measurement marks 83. Accordingly, it is possible to calculate the relative actual position of the measurement tape 80 with respect to the fiducial mark 53 regardless of the positional information (rotational angle, positional coordinates on the control) of the driving device 60. Therefore, it is possible to measure the operation accuracy of the driving device 60 without requiring a sensor for detecting the position and angle of the driving device 60.

In addition, the measurement target is a feeder 50 that supplies electronic components by pitch feeding the component tapes accommodating the electronic components as moving bodies by the driving device 60 in the transfer direction. The measurement jig is a measurement tape 80 formed to be capable of performing the pitch feeding by the driving device 60 corresponding to the component tape. With such a configuration, the measurement device 1 measures the accuracy of the component tape transfer operation using the measurement tape 80 by setting the feeder 50 as the measurement target. In the measurement of the operation accuracy, the measurement tape 80 imitating the component tape is transferred through the tape conveyance path inside the feeder 50. Therefore, scratches or the like may be generated on the surface of the measurement tape 80 due to sliding with a tape guide or the like. Such scratches affect the recognition precision of the measurement mark 83 in an image processing. On the other hand, with the configuration described above, the measurement device 1 can calculate the actual position of the measurement jig (measurement tape 80) by appropriately supplementing the multiple measurement marks 83 in the image data. Therefore, it is particularly useful to apply the measurement device 1 of the disclosure to measure the operation accuracy using the feeder 50 as the measurement target.

In addition, a stepping motor (motor 61) is used as the driving device 60 of the feeder 50. The control device of the feeder 50 performs open loop control of the stepping motor based on an instruction input from the outside and performs pitch feeding of the component tapes. In such open loop control, compared with feedback control, the device configuration can be simplified, the control load can be reduced, and the correction amount during operation directly affects the operation accuracy. Therefore, a more appropriate setting of the correction amount is required corresponding to the driving device 60 that performs open loop control. On the other hand, with the configuration as described above, since the positional relationship between the multiple measurement marks 83 is reflected on the measurement accuracy of the measurement device 1 in the measurement device 1, the measurement accuracy of the measurement device 1 can be improved. Therefore, it is possible to more appropriately set the correction amount used for the open loop control. Therefore, it is particularly useful to apply the measurement device 1 of the disclosure to the measurement of the operation accuracy of the feeder 50 including the driving device 60 driven by open loop control.

<Modification Aspect of Embodiment>
(Regarding Application of Measurement Device 1)

In the embodiment, in order to improve the accuracy of measurement of the operation accuracy of the feeder 50, the measurement device 1 is configured to calculate the actual position of the measurement tape 80 using multiple measurement marks 83. Specifically, in a case where the number of measurement marks 83 which are valid for measuring the operation accuracy is equal to or more than the defined value Mn (=2) (S25: Yes), the measurement device 1 measures the positioning error (S26 to S28).

On the other hand, in a case where the measurement device 1 has an object of increasing the number of times of service or extending the service life of the measurement tape 80 which is the measurement jig, the measurement device 1 may be configured to calculate the actual position of the measurement tape 80 using at least one valid measurement mark 83. Specifically, the measurement device 1 sets the defined value Mn described above to 1. According to such a configuration, the measurement device 1 performs image processing on multiple measurement marks 83 included in the image data as a target and it is possible to measure the operation accuracy using the measurement tape 80, except a case where all the measurement marks 83 are not valid.

Here, in a configuration in which the actual position of the measurement tape 80 is calculated only for the measurement mark 83 which is at the ideal distance Dm in the transfer direction from the fiducial mark 53 as a target, if the measurement mark 83 is determined as invalid for measurement due to contamination of the peripheral edge or scratch, the measurement process of the operation accuracy is interrupted. On the other hand, with the configuration described above, image processing is performed with respect to multiple measurement marks 83 which are fitted in the camera visual field 11 as a target, and the measurement process of the operation accuracy can be continued due to the remaining of at least one valid measurement mark 83.

Since at least one of the multiple measurement marks 83 indicates the actual position of the measurement tape 80, the measurement device 1 appropriately complements the multiple measurement marks 83 in the image data and can calculate the actual position of the measurement tape 80. Accordingly, it is possible to increase the number of times of service and extend the service life of the measurement tape 80. However, from a viewpoint of improving the measurement accuracy of the positioning error, an aspect exemplified in the embodiment (aspect in which defined value Mn is set to 2 or more) is preferable.

(Regarding Image Processing)

In the embodiment, the image processing section 23 calculates the actual position of the measurement tape 80 averaged based on the multiple valid measurement marks 83 and the defined interval P in the transfer direction (S27). On the other hand, the image processing section 23 may adopt various aspects as long as an image processing section calculates the actual position of the measurement tape 80 based on the multiple measurement marks 83 included in the image data.

Specifically, for example, it is assumed that the actual position of the measurement tape 80 is calculated by extracting a defined number of measurement marks 83 in order from the highest circularity among the multiple recognized measurement marks 83. This is a configuration utilizing the fact that it is possible to regard that the actual position is more accurately indicated as the circularity among the measurement marks 83 becomes higher.

In addition, when presenting the measurement result of the positioning error in the transfer direction by the driving device 60, the control device 20 may also present the result of the image processing. Specifically, by presenting the ratio and the respective circularity of valid measurement marks 83 among the multiple measurement marks 83 included in the image data, the reliability of the measurement result and the replacement timing of the measurement tape 80 can be guided.

(Regarding Fiducial Mark 53 and Measurement Mark 83)

In the embodiment, the fiducial mark 53 provided on the feeder 50 and the measurement mark 83 arranged on the measurement tape 80 are formed in a circular shape. On the other hand, the fiducial mark 53 and the measurement mark 83 can adopt various shapes as long as the fiducial mark 53 and the measurement mark 83 have a defined shape. In addition, instead of the through hole, the measurement mark 83 may be configured to be formed on the surface of the tape main body 81, for example, by processing such as laser marking.

In addition, in the embodiment, the feeder 50 is provided with one fiducial mark 53. On the other hand, multiple fiducial marks 53 are provided on the feeder 50, and the measurement device 1 may be configured to perform image processing on multiple fiducial marks 53 included in the image data as a target and to calculate the actual position of the measurement tape 80.

Specifically, in the feeder 50 which is the measurement target, fiducial marks 53 are arranged at multiple different positions that are fitted in the camera visual field 11, respectively. The image processing section 23 calculates the relative positions of the multiple measurement marks 83 with respect to the multiple fiducial marks 53 included in the image data, respectively, and calculates the actual position of the measurement tape 80 based on the calculation result.

According to such a configuration, the relative positions of the multiple fiducial marks 53 and the multiple measurement marks 83 are reflected on the measurement accuracy of the measurement device 1, respectively. Therefore, the measurement accuracy of the measurement device 1 can be further improved. In addition, the measurement device 1 can calculate the actual position of the measurement tape 80 by appropriately supplementing the multiple fiducial marks 53 in the image data. Accordingly, it is possible to extend the service life relating to the fiducial mark 53.

In addition, in the configuration in which multiple fiducial marks 53 are disposed on the feeder 50 as described above, the image processing section 23 may be configured to perform determination of validity with respect to the multiple fiducial marks 53, similarly to the determination (S25) of the validity of the measurement mark 83 in the embodiment. Specifically, the image processing section 23 acquires the fiducial mark information including the position or shape of the multiple fiducial marks 53 in the image data and uses the fiducial mark 53 determined to be valid based on the fiducial mark information and thus calculates the actual position of the measurement tape 80.

According to such a configuration, it is possible to exclude the fiducial mark 53 which is not valid for image processing for calculating the actual position of the measurement tape 80. In addition, in a case where there are multiple valid fiducial marks 53, the actual position of the measurement tape 80 can be calculated by complementing each other. Accordingly, it is possible to extend the service life relating to the fiducial mark 53 of the feeder 50, as compared with a configuration in which error processing is performed in a case where only one fiducial mark 53 is not valid for image processing.

(Application Range of Measurement Device 1)

In the embodiment, in order to set an appropriate correction amount in the feeder 50, the measurement device 1 measures the operation accuracy of the driving device 60 in the feeder 50. On the other hand, for example, in order to check whether or not the set correction amount is appropriate, the measurement device 1 is used for measuring the operation accuracy of the driving device 60 in the feeder 50.

In the measurement of the operation accuracy as described above, the control device 20 of the measurement device 1 instructs the feeder control section 70 of the feeder 50 to apply the correction amount set in advance to the operation control of the driving device 60. In other words, the pulse power corresponding to one pitch in the transfer operation (corresponding to S12 of the embodiment) is determined as numbers of pulses reflecting the correction amount according to a state of the driving device 60 (for example, rotation angle of reduction gear 62).

Then, similar to the embodiment, the measurement device 1 calculates the actual position of the measurement tape 80 based on the image data, thereby acquiring the difference between the corrected theoretical transfer amount and the actually measured transfer amount. The measurement device 1 can inspect whether or not the correction amount is appropriate, depending on whether or not the acquired difference in the transfer amount is within the allowable range.

In addition, in the embodiment, the measurement device 1 sets the feeder 50 as the measurement target and is used for measurement of the operation accuracy of the driving device 60 of the feeder 50. On the other hand, as long as the measurement target has a driving device that moves the moving body in the defined transfer direction, the measurement device can apply the measurement target to the measurement of the operation accuracy of the driving device as a target.

Specifically, the measurement device can be applied, for example, as a device for inspecting the accuracy of the transfer operation of electronic components in a component mounting machine (see PTL 2: JP-A-2005-216974). According to this aspect, the moving body is a mounting head that holds electronic components. The driving device is a driving device (XY-robot) that moves the mounting head in the XY-directions. In addition, the measurement camera constituting the measurement device is provided in the driving device together with the mounting head.

Then, the measurement device measures the operation accuracy using the matrix board arranged in the movable range of the driving device in the machine of the component mounting machine as the measurement jig. In other words, the measurement device repeats the transfer operation in the defined transfer direction (for example, X-direction) by the driving device and the operation for imaging the index mark (corresponding to "measurement mark" of the disclosure) provided on the matrix board. The multiple index marks arranged in the defined transfer direction are set at defined intervals and arranged so as to be fitted in the visual field of the camera of the measurement camera.

The measurement device acquires image data by imaging and performs image processing on multiple index marks included in the image data as a target, in the same manner as in the embodiment. Then, the measurement device measures the operation accuracy of the driving device based on the control position of the mounting head at the time of imaging and the actual position of the mounting head calculated as the relative position with respect to the matrix board by the image processing. According to such a configuration, the same effect as the embodiment is obtained.

In other words, since the positional relationship between the multiple index marks is reflected on the measurement accuracy of the measurement device, the measurement accuracy of the measurement device can be improved. In addition, multiple index marks indicate the actual position of the mounting head with respect to the matrix board. Thus, the measurement device can calculate the actual position of the mounting head by appropriately supplementing the multiple index marks in the image data. Therefore, it is possible to extend the service life relating to the matrix board which is the measurement jig.

In addition, according to the aspect, in the configuration that can recognize the coordinate position on the control of the moving body (mounting head), the measurement device does not necessarily need the fiducial mark 53 that is fitted in the camera visual field 11. In other words, in the aspect exemplified in the embodiment, if the positional relationship between the feeder 50 and the measurement camera 10 held by the feeder holding section 3 is guaranteed accurately, for example, by using the center of the image data as a reference, the fiducial mark 53 can be omitted.

However, from a viewpoint of improving the manufacturing cost and measurement accuracy of the measurement device, a configuration that can calculate the actual position of the measurement tape 80 based on one image data is desired, regardless of the installation accuracy of the measurement camera 10. In other words, as exemplified in the embodiment, the fiducial mark 53 is provided at a position which is fitted in the camera visual field 11, and based on the relative positions of the multiple measurement marks 83 with respect to the fiducial mark 53, a configuration for calculating the actual position of the measurement jig (measurement tape 80) is preferable.

REFERENCE SIGNS LIST

1: measurement device, 2: base, 3: feeder holding section, 10: measurement camera, 20: control device, 21: movement control section, 22: imaging control section, 23: image processing section, 24: error measurement section, 50: feeder (measurement target), 51: case, 52: rail, 52a: window section, 53: fiducial mark, 60: driving device, 61: motor, 61a: rotation shaft, 61b: driving gear, 62: reduction gear, 62a: large-diameter gear, 62b: small-diameter gear, 63: intermediate gear, 64: sprocket, 64a: engagement protrusion, 64b: driven gear, 70: feeder control section, 80: measurement tape (measurement jig), 81: tape main body, 82: feed hole 83, 83A to 83E: measurement mark, Fc: camera visual field, Wf: width (of camera visual field in transfer direction), P: defined interval (of measurement mark), Da to De: actual distance, Dm: ideal distance, Mn: defined value, ΔS: positioning error, Ni: tape insertion section, Nt: component pickup section

The invention claimed is:

1. A measurement device that measures an operation accuracy of a driving device which moves a component tape that accommodates a plurality of electronic components in a defined transfer direction in a measurement target, the device comprising:
   a camera that has a predetermined visual field; and
   circuitry configured to:
   send an instruction value to the driving device to position a measurement tape at an instructed position in the transfer direction, the measurement tape configured to imitate the component tape and having a plurality of measurement marks arranged at a defined interval narrower than a width of the visual field along the transfer direction;
   control the camera to image the positioned measurement tape including the plurality of measurement marks;
   acquire an image data generated by the camera as a result of the imaging;
   acquire a position of a first of the plurality of the measurement marks in a first image of the image data;
   acquire a position of a second of the plurality of the measurement marks in the first image of the image data;
   acquire a position of a third of the plurality of the measurement marks in the first image of the image data;
   acquire a position of a fourth of the plurality of the measurement marks in the first image of the image data;
   calculate an actual position of the measurement tape based on the positions of the first, the second, the third, and the fourth of the plurality of the measurement marks in the first image of the image data; and
   measure a positioning error in the transfer direction due to the driving device based on the instructed position and the actual position.

2. The measurement device according to claim 1, wherein the circuitry is configured to:
   calculate the actual position of the measurement tape averaged based on the positions of the first, the second, the third, and the fourth of the plurality of the measurement marks and the defined interval.

3. The measurement device according to claim 1, wherein the circuitry is configured to:
   acquire measurement mark information including the positions or shapes of the plurality of the measurement marks in the image data, and
   calculate the actual position of the measurement tape using at least one measurement mark determined to be valid based on the measurement mark information.

4. The measurement device according to claim 1,
   wherein, in the measurement target, a fiducial mark is disposed at a position which is fitted in the visual field, and
   wherein the circuitry is configured to:
   calculate relative positions of the plurality of the measurement marks with respect to the fiducial mark which is included in the image data, and
   calculate the actual position of the measurement tape based on the relative positions.

5. The measurement device according to claim 4,
   wherein the fiducial mark includes a plurality of fiducial marks disposed in the measurement target at a plurality of different positions Which are fitted in the visual field, and
   wherein the circuitry is configured to:
   respectively calculate relative positions of the plurality of the measurement marks with respect to the plurality of the fiducial marks which are included in the image data, and
   calculate the actual position of the measurement tape based on the relative positions.

6. The measurement device according to claim 5, wherein the circuitry is configured to:
   acquire fiducial mark information including positions or shapes of the plurality of the fiducial marks in the image data, and
   calculate the actual position of the measurement tape using at least one fiducial mark determined to be valid based on the fiducial mark information.

7. The measurement device according to claim 1,
   wherein the measurement target is a feeder which performs pitch feeding of the component tape in the transfer direction by the driving device to supply the electronic components, and
   wherein the measurement tape is configured to be pitch fed by the driving device in a manner corresponding to a manner in which the component tape is pitch fed.

8. The measurement device according to claim 1, wherein the measurement tape is configured to be moved by the driving device in a manner corresponding to a manner in which the component tape is moved.

9. The measurement device according to claim 1, wherein the measurement tape includes a plurality of feeding holes.

10. The measurement device according to claim 9, wherein the plurality of feeding holes are arranged in the transfer direction at a same interval as feeding holes of the component tape.

11. The measurement device according to claim 1, wherein the measurement tape is formed of metal.

12. The measurement device according to claim 1, wherein the measurement tape is set to have a thickness corresponding to a thickness of the component tape.

13. The measurement device according to claim 1, wherein the plurality of measurement marks are holes in the measurement tape.

14. The measurement device according to claim 9, wherein
   the plurality of feeding holes are arranged in the transfer direction, and
   at least two of the plurality of measurement marks are disposed between two of the plurality of feeding holes in the transfer direction.

15. The measurement device according to claim 4, wherein the fiducial mark is not formed on the measurement tape.

16. The measurement device according to claim 1, wherein the circuitry is configured to determine and store a correction amount based on the positioning error calculated corresponding to division by one pitch.

17. A measurement system including:
- the measurement device according to claim 1; and
- the measurement tape.

18. The measurement system according to claim 17, wherein
- the measurement target is a feeder which feeds the component tape by the driving device and is configured to be set in a feeder holding section of the measurement device, and
- the measurement tape is installed in the feeder.

19. The measurement system according to claim 18, wherein the circuitry is configured to send the instruction value to a control section of the feeder.

\* \* \* \* \*